(12) United States Patent
Chiu et al.

(10) Patent No.: US 11,699,629 B2
(45) Date of Patent: Jul. 11, 2023

(54) INTEGRATED CIRCUIT DIE STACKED WITH BACKER DIE INCLUDING CAPACITORS AND THERMAL VIAS

(71) Applicant: Qorvo US, Inc., Greensboro, NC (US)

(72) Inventors: Anthony Chiu, Richardson, TX (US); Bror Peterson, Fairview, TX (US); Andrew Ketterson, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 106 days.

(21) Appl. No.: 17/213,974

(22) Filed: Mar. 26, 2021

(65) Prior Publication Data

US 2022/0310471 A1  Sep. 29, 2022

(51) Int. Cl.
| | |
|---|---|
| H01L 23/367 | (2006.01) |
| H01L 23/373 | (2006.01) |
| H01L 25/18 | (2023.01) |
| H01L 23/48 | (2006.01) |
| H01L 23/66 | (2006.01) |
| H01L 23/00 | (2006.01) |
| H01L 49/02 | (2006.01) |

(52) U.S. Cl.
CPC ........ *H01L 23/367* (2013.01); *H01L 23/3736* (2013.01); *H01L 23/3738* (2013.01); *H01L 23/481* (2013.01); *H01L 23/66* (2013.01); *H01L 24/29* (2013.01); *H01L 24/32* (2013.01); *H01L 25/18* (2013.01); *H01L 28/90* (2013.01); *H01L 2223/6683* (2013.01); *H01L 2224/29111* (2013.01); *H01L 2224/29144* (2013.01); *H01L 2224/32265* (2013.01)

(58) Field of Classification Search
CPC .. H01L 23/367; H01L 23/3736; H01L 23/481
See application file for complete search history.

(56) References Cited

U.S. PATENT DOCUMENTS

| | | | | |
|---|---|---|---|---|
| 8,339,790 | B2 * | 12/2012 | Reza | H05K 1/115 333/204 |
| 2019/0013301 | A1 * | 1/2019 | Cheah | H01L 23/49822 |
| 2021/0159224 | A1 * | 5/2021 | Shen | H01L 28/75 |

* cited by examiner

*Primary Examiner* — Dale E Page
*Assistant Examiner* — Wilner Jean Baptiste
(74) *Attorney, Agent, or Firm* — Withrow & Terranova, P.L.L.C.

(57) ABSTRACT

The disclosure is directed to an integrated circuit (IC) die stacked with a backer die, including capacitors and thermal vias. The backer die includes a substrate material to contain and electrically insulate one or more capacitors at a back of the IC die. The backer die further includes a thermal material that is more thermally conductive than the substrate material for thermal spreading and increased heat dissipation. In particular, the backer die electrically couples capacitors to the IC die in a stacked configuration while also spreading and dissipating heat from the IC die. Such a configuration reduces an overall footprint of the electronic device, resulting in decreased integrated circuits (IC) packages and module sizes. In other words, instead of placing the capacitors next to the IC die, the capacitors are stacked on top of the IC die, thereby reducing an overall surface area of the package.

20 Claims, 4 Drawing Sheets

INTEGRATED CIRCUIT DIE STACKED WITH BACKER DIE INCLUDING CAPACITORS AND THERMAL VIAS

FIELD OF THE DISCLOSURE

The present invention relates to packaging of integrated circuits (ICs). In particular, the present invention relates to an IC die stacked with a backer die, including capacitors and thermal vias.

BACKGROUND

Mobile devices, such as cellular phones, demand increasingly smaller integrated circuits (ICs), including radio frequency (RF) circuits. The performance of high-frequency RF circuits in general and monolithic microwave integrated circuits (MMICs) in particular is sensitive to operating temperature of IC components. Further decreasing of IC packages and module sizes becomes challenging, particularly regarding transferring heat from IC components.

SUMMARY

Embodiments of the disclosure are directed to an integrated circuit (IC) die stacked with a backer die, including capacitors and thermal vias. The backer die includes a substrate material to contain and electrically insulate one or more capacitors at a back of the IC die. The backer die further includes a thermal material that is the same or more thermally conductive than the substrate material for thermal spreading and increased heat dissipation. In particular, the backer die electrically couples capacitors to the IC die in a stacked configuration while also spreading and dissipating heat from the IC die. Such a configuration reduces an overall footprint of the electronic device, resulting in decreased integrated circuit (IC) packages and module sizes. In other words, instead of placing the capacitors next to the IC die, the capacitors are stacked on top of the IC die, thereby reducing an overall surface area of the package.

One embodiment of the disclosure relates to an electronic device, including a backer die including a substrate comprising a first thermally conductive material. The backer die further includes at least one thermal via within the substrate. The plurality of thermal vias comprising a second thermally conductive material that is equal or more thermally conductive than the first thermally conductive material. The backer die further includes at least one capacitor within the substrate. The electronic device further includes an integrated circuit (IC) die stacked onto the backer die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms.

These terms are only used to distinguish one element from another. For example, a first element could be termed an "upper" element, and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments of the disclosure are directed to an integrated circuit (IC) die stacked with a backer die, including capacitors and thermal vias. The backer die includes a substrate material to contain and electrically insulate one or more capacitors at a back of the IC die. The backer die further includes a thermal material that is equal or more thermally conductive than the substrate material for thermal spreading and increased heat dissipation. In particular, the backer die electrically couples capacitors to the IC die in a stacked configuration while also spreading and dissipating heat from the IC die. Such a configuration reduces the overall footprint of the electronic device, resulting in decreased integrated circuit (IC) packages and module sizes. In other words, instead of placing the capacitors next to the IC die, the capacitors are stacked on top of the IC die, thereby reducing an overall surface area of the package.

Figure 1A:
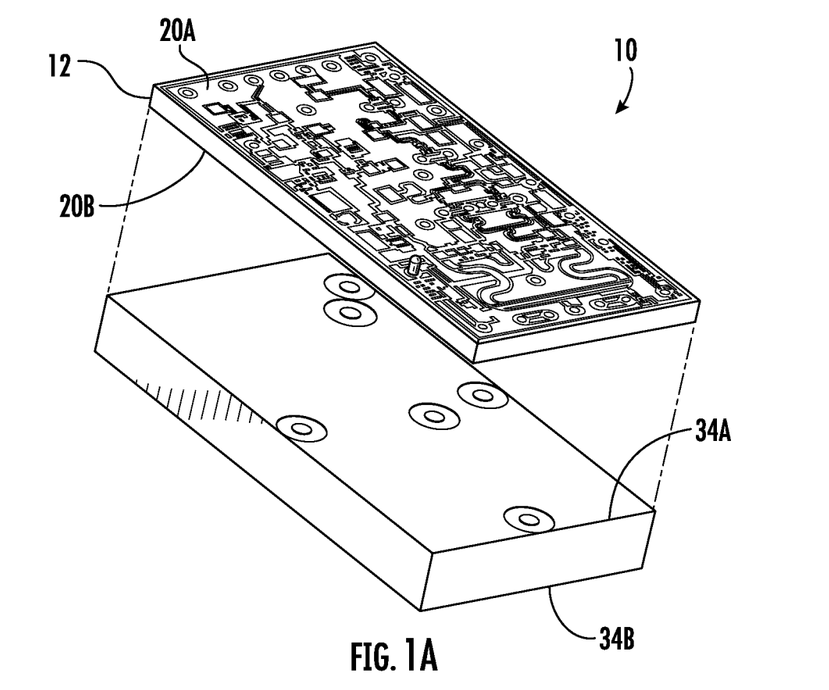
FIG. 1A is a top perspective exploded view of an electronic device with an integrated circuit (IC) die stacked onto a backer die.
Figure 1B:
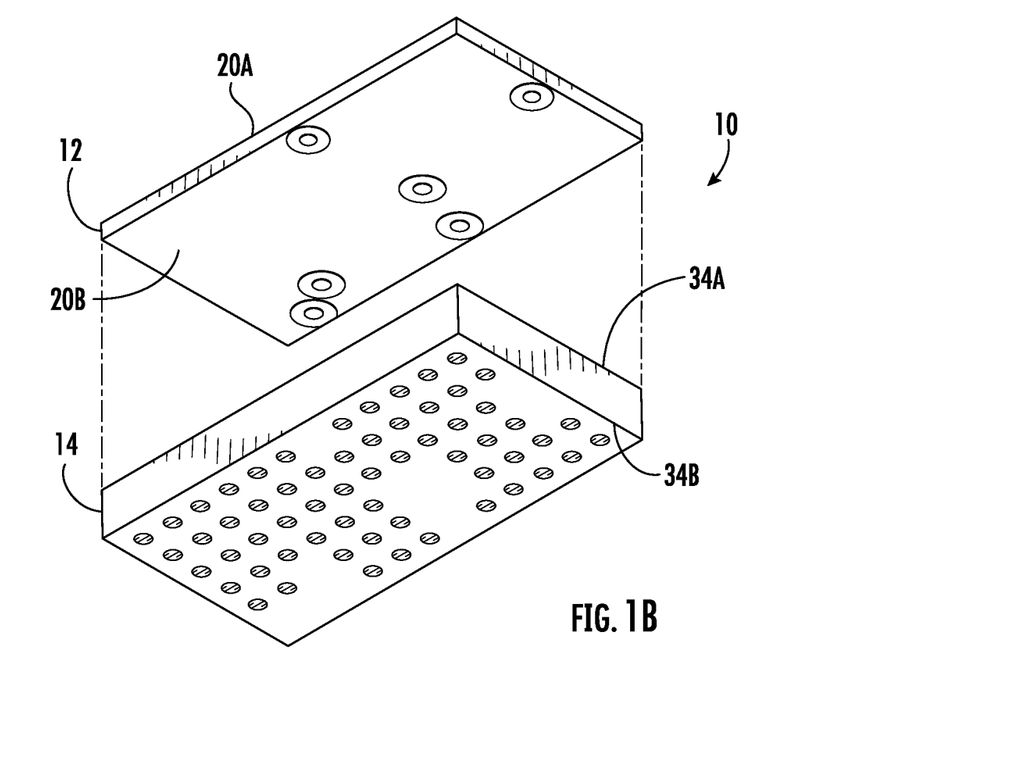
FIG. 1B is a bottom perspective exploded view of the electronic device of FIG. 1A.
Figure 1C:
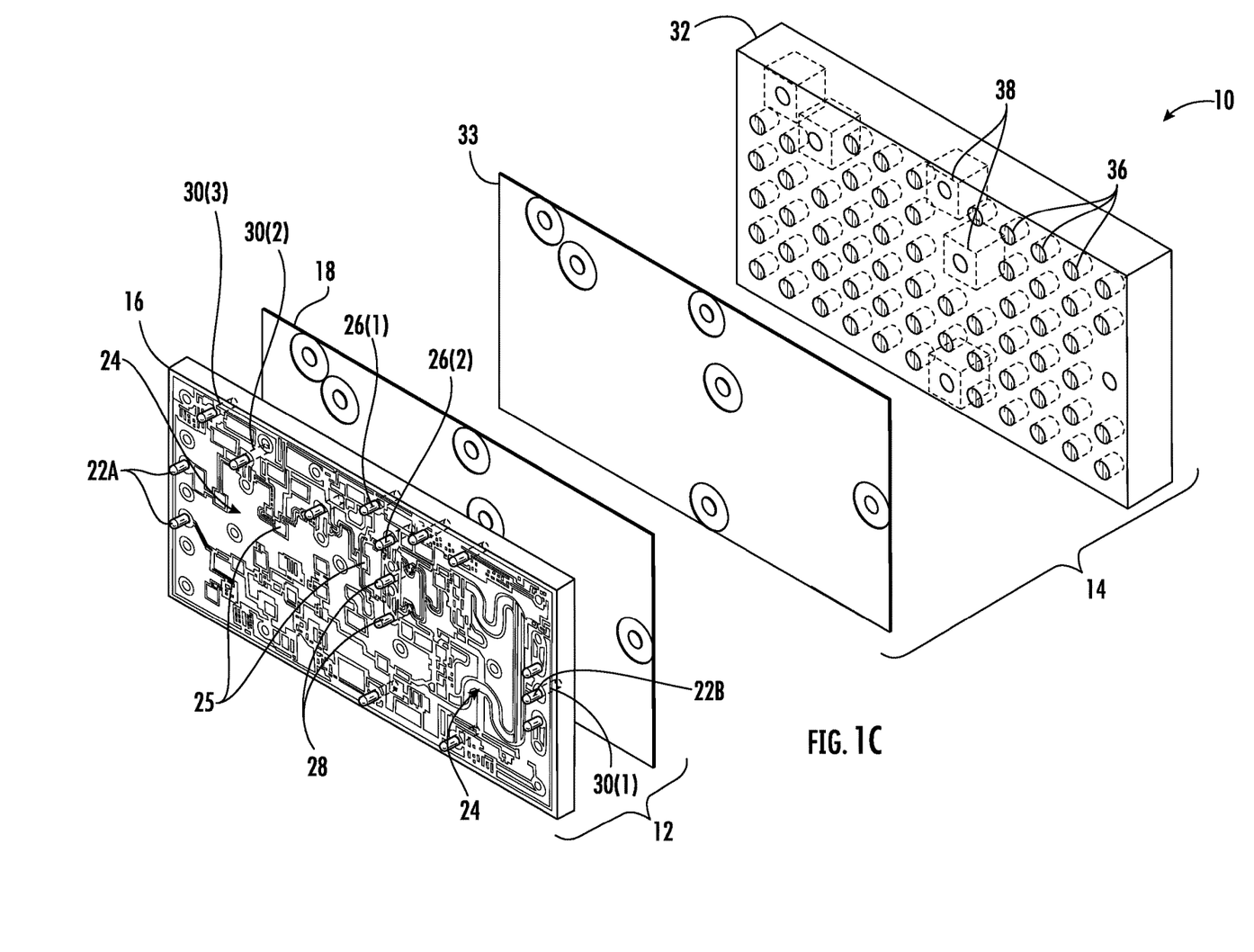
FIG. 1C illustrates an exploded perspective view of the electronic device of FIG. 1A with the IC plating exploded from the IC die and the backer plating exploded from the backer die.

FIGS. 1A-1C illustrate an electronic device 10 with an integrated circuit (IC) die 12 and a backer die 14. In particular, the electronic device 10 (may also be referred to herein as an IC package, IC circuit package, stacked assembly, etc.) includes an integrated circuit (IC) die 12 stacked onto a backer die 14. The IC die 12 includes active components, while the backer die 14 includes capacitors and/or thermal materials. Accordingly, the backer die 14 electrically couples capacitors to the IC die 12 in a stacked configuration while also spreading and dissipating heat from the IC die 12. The electronic device 10 disclosed herein provides efficient heat transfer, robust radio frequency (RF) performance, and operation through millimeter wave (mmW) frequencies, all in a miniature, low-cost, low-profile, low-footprint package (e.g., surface-mountable (SM)).

The IC die 12 includes an IC substrate 16 and/or an IC plating 18. The IC die 12 further includes an active side 20A (may also be referred to as a topside, upper side, upper surface, etc.) and a backside 20B (may also be referred to as a bottom side, lower side, lower surface, etc.) opposite thereto. The active side 20A includes active components (e.g., transistors, diodes, RF transmission lines, etc.). In particular, the active side 20A includes input terminals 22A (e.g., RF input terminals), output terminals 22B (e.g., RF output terminals), transmission line 24, amplifiers 25, capacitor terminals 26, and/or grounding terminal 28. The IC die 12 includes IC vias 30 (may also be referred to as conductive vias, hot vias, through conductive vias (TCVs), through-substrate vias (TSVs), etc.) extending from the active side 20A through the IC substrate 16 to a backside 20B of the IC die 12. The IC vias 30 include signal vias 30 to propagate communication signals between the active side 20A and the backside 20B. The IC vias 30 further include capacitor vias 30(2), 30(3) to establish connection between the active side 20A to the backside 20B. The RF output 22B can be connected to an external hardware by via 30(1). The IC vias 30 may be a variety of shapes, sizes, patterns, and other configurations. In certain embodiments, the IC die has solder or copper pillar bumps (e.g., as used for flip-chip attachment to a higher level substrate in the assembly). Numerous ground vias connect to the IC plating 18.

The IC plating 18 is at the backside 20B of the IC die 12. The IC plating 18 facilitates insulated electrical coupling between the IC die 12 and the backer die 14. In particular, the IC plating 18 facilitates electrical coupling between the IC vias 30 of the IC die 12 and the backer die 14.

The backer die 14 is positioned at or proximate the backside 20B of the IC die 12. The backer die 14 includes a substrate 32 and a backer plating 33 (which may be similar, the same, or equivalent to IC plating 18). The backer die 14 provides a primary heat path for the active components of the IC die 12. The backer die 14 includes an active side 34A (may also be referred to as a topside, upper side, upper surface, etc.) and a backside 34B (may also be referred to as a bottom side, lower side, lower surface, etc.) opposite thereto. The backer die 14 provides highly efficient thermal spreading and heat transfer from components (e.g., active components such as diodes and transistors and/or passive components, such as RF transmission lines, tuning networks, interconnecting inductors, capacitors, inductors, etc.) on the active side 20A of the IC die 12 through the backside 20B of the IC die 12 through the active side 34A of the backer die 14 to the backside 34B of the backer die 14.

The substrate 32 of the backer die 14 includes a first thermally conductive material (may also be referred to herein as a substrate material). In certain embodiments, the first thermally conductive material includes silicon, Silicone carbide (SiC), diamond, Aluminum nitride (AlN), glass, etc.).

The backer die 14 further includes at least one backer via 36 (may also be referred to as conductive vias, hot vias, TCVs, TSVs, etc.) within the substrate 32 extending from the active side 34A through the substrate 32 to the backside 34B of the backer die 14. The backer vias 36 include thermal vias 36 to propagate heat between the active side 34A and the backside 34B. In certain embodiments, the backer vias 36 further include capacitor vias to form the positive terminal of capacitor 38. In certain embodiments, the backer plating 33 is the ground.

The thermal vias 36 include a second thermally conductive material that is more thermally conductive than the first thermally conductive material. For example, in certain embodiments, the second thermally conductive material includes copper. The substrate 32 electrically insulates the thermal vias 36 from each other. The thermal vias 36 may be a variety of shapes, sizes, patterns, and other configurations.

In certain embodiments, the backer plating 33 of the backer die 14 is at the active side 34A of the substrate 32. The backer plating 33 facilitates insulated electrical coupling between the IC die 12 and the backer die 14. In particular, the backer plating 33 facilitates electrical coupling between the IC vias 30 of the IC die 12 and the backer vias 36 of the backer die 14.

The backer die 14 further includes at least one capacitor 38 (e.g., high-density capacitor, high-k dielectrics, ferroelectric dielectrics, deep trench capacitor, etc.) within the substrate 32. A deep trench capacitor is a three-dimensional vertical capacitor and may be formed by etching a deep trench into a silicon substrate. In certain embodiments, the capacitors 38 are used for RF bypass, RF decoupling, tuning (e.g., fixed or tunable varactors), energy storage, and/or thermal vias. Each of the capacitors 38 is electrically coupled to the active side 20A of the IC die 12 through the IC vias 30 of the IC die 12. In particular, each of the capacitors 38 is electrically coupled through the backer plating 33, IC plating 18, and IC vias 30 to active components at the active side 20A of the IC die 12.

Figure 2A:
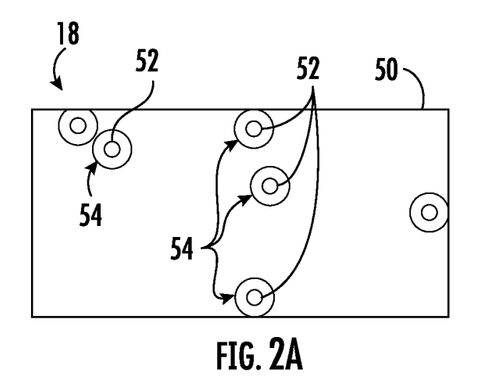
FIG. 2A is a view of ground plane plating of the IC die of FIGS. 1A-1C.

FIG. 2A is a view of IC plating 18 of the IC die 12. In certain embodiments, the IC plating 18 includes at least one of gold or tin. In certain embodiments, the IC plating 18 includes an IC plating body 50 and at least one IC capacitor pad 52 (may also be referred to as an IC capacitor I/O pad, IC signal pad, interconnects, etc.) electrically insulated from the IC plating body 50 by at least one IC capacitor aperture 54. The IC capacitor pads 52 are configured to align with capacitors 38 within the backer die 14. IC plating 18 is generally known as a ground plane with islands of pads 52, where the IC plating body and the pads 52 form the positive and negative terminals of a capacitor 38, respectively.

Figure 2B:
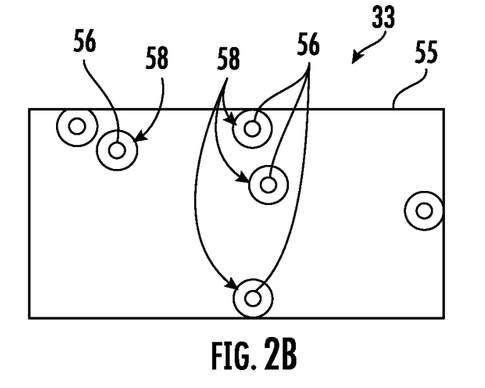
FIG. 2B is a view of the backer plating of the backer die of FIGS. 1A-1C.

FIG. 2B is a view of backer plating 33 of the backer die 14. In certain embodiments, the backer plating 33 includes at least one of gold or tin. In certain embodiments, the backer plating 33 includes a backer plating body 55 and at least one backer capacitor pad 56 (may also be referred to as a backer capacitor I/O pad, backer signal pad, interconnects, etc.) electrically insulated from the backer plating body 55 by a backer capacitor aperture 58. The backer capacitor pads 56 are configured to align with capacitors 38 within the backer die 14.

Referring to FIGS. 2A-2B, the pattern and orientation of the IC plating 18 with the backer plating 33 are the same or at least similar. In particular, the IC capacitor pads 52 and/or IC capacitor apertures 54 are aligned with the backer capacitor pads 56 and/or backer capacitor apertures 58. In this way, the at least one IC capacitor pad 52 is aligned and electrically coupled with the at least one backer capacitor pad 56.

Figure 3:
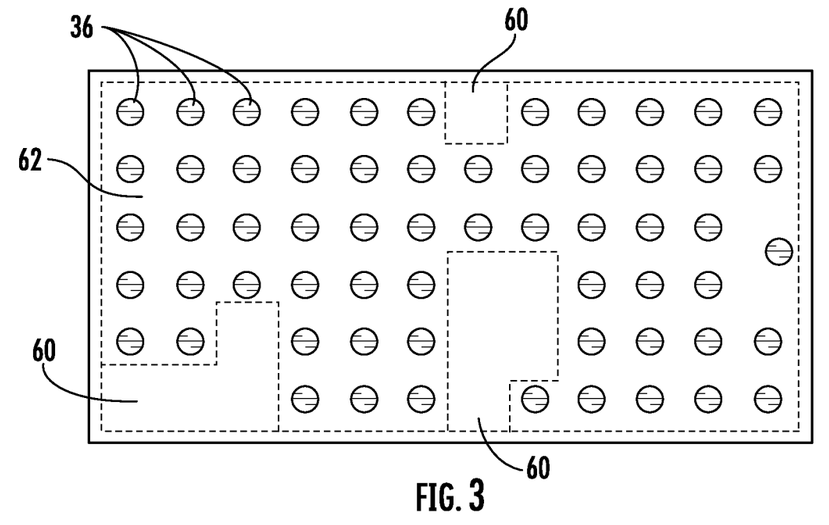
FIG. 3 is a back view of the backer die of FIGS. 1A-1C illustrating thermal regions.

FIG. 3 is a back view of the backer die 14 illustrating non-thermal regions 60 and thermal regions 62. At least some of the non-thermal regions 60 correspond to locations of capacitors 38 within the backer die 14. The thermal regions 62 include one or more thermal vias 36. In certain embodiments, these thermal vias 36 correspond to locations of amplifiers (or other heat-generating active components) of the IC die 12.

Configurations of the thermal regions 62 may depend on the thermal requirements, manufacturing costs, etc., of the electronic device. For example, filling an entire thermal region 62 with thermal material may increase heat conductivity but also increase cost. Meanwhile, patterning the thermal region 62 with thermal material may balance heat conductivity requirements with decreased cost. Accordingly, in other embodiments, the thermal vias 36 are large continuous blocks of material (rather than isolated vias). In certain embodiments, the plurality of thermal vias 36 are patterned in a two-dimensional array. In certain embodiments, the thermal vias 36 are all the same size. In other embodiments, the thermal vias 36 differ from each other in size, shape, and/or configuration, etc. In certain embodiments, the thermal regions 62 are uniformly spread throughout the substrate 32. In other embodiments, the thermal regions 62 are relegated to certain areas.

Referring to FIGS. 1A-1B, in certain embodiments, the IC die 12 is bonded (e.g., wafer to wafer bonding, die to wafer bonding, etc.) to the backer die 14. In certain embodiments, the IC die 12 is bonded to the backer die 14 using metal to metal bonds, solders (e.g., AuSn), conductive adhesives, sintered materials, DBII bonding techniques, and/or hybrid bonding techniques, etc. Accordingly, the IC plating 18 of the IC die 12 contacts (e.g., directly contacts) the backer plating 33 of the backer die 14. In particular, the IC capacitor pads 52 are aligned with and contact the backer capacitor pads 56. Similarly, the IC capacitor apertures 54 are aligned with the backer capacitor apertures 58. Accordingly, the contacts between the pads 52, 56 are electrically isolated from the bodies 50, 55 of the IC plating 18 and the backer plating 33.

As noted above, the backer die 14 includes capacitors 38 (e.g., deep trench capacitors) with thermal vias 36 extending between the active side 34A and the backside 34B of the backer die 14. The thermal vias 36 are adjacent to the capacitors 38. As a result, the backer die 14 acts as a heat spreader, drawing heat from the IC die 12 and conducting the heat away from the IC die 12 through the backer die 14.

Stacking the IC die 12 to the backer die 14 results in a reduced footprint. In particular, stacking the capacitors of the backer die 14 with the IC die 12 reduces the footprint while also providing thermal conduction.

Figure 4:
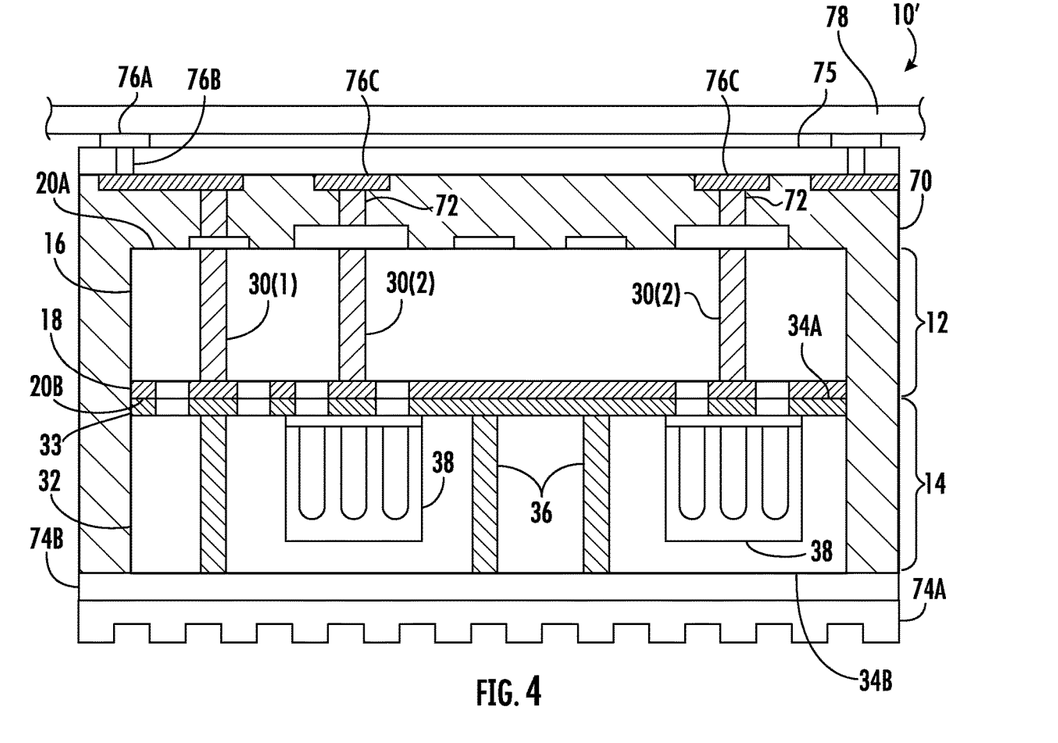
FIG. 4 is a cross-sectional side view of an embodiment of the electronic device of FIGS. 1A-3.

FIG. 4 is a cross-sectional side view of an embodiment of the electronic device of FIGS. 1-3. In certain embodiments, the IC die 12 includes a monolithic microwave integrated circuit (MMIC). In certain embodiments, the MMIC is manufactured on a III-V substrate. It is noted that placing the capacitors 38 close to the IC die 12 reduces inductance between the capacitors 38 and the IC die 12. In certain embodiments, the capacitances of the capacitors may be about or greater than 1 uF/mm$^2$. In certain embodiments, the backer die 14 is bonded to the backside 20B of the IC die 12 with backside hot via interconnects.

As noted above, in certain embodiments, the IC die 12 includes a plurality of amplifiers 25 (e.g., wide-band amplifiers). The plurality of thermal vias 36 are aligned with the amplifiers 25 (e.g., each of the amplifiers 25) of the IC die 12. In certain embodiments, a first portion of the plurality of thermal vias 36 are aligned with each amplifier 25 of the IC die 12, and a second portion of the plurality of thermal vias 36 are not aligned with any amplifier 25 of the IC die 12. In other embodiments, thermal vias 36 are only aligned with amplifiers 25 of the IC die 12. In other words, in certain embodiments, thermal vias 36 are only used for select active components of the IC die 12 that generate large amounts of heat.

In certain embodiments, the circuit package includes the IC die 12 and the backer die 14 surrounded by an overmold layer 70. An interconnection layer attaches the IC die 12 to a printed circuit board 76 (PCB) or another component that supports the IC package 10 and/or electrically connects the IC die 12 to other components in an RF device (e.g., a mobile device or base station). In this regard, the IC package 10 can form an RF module in which the substrate 32 is packaged using any suitable type of IC packaging. For example, IC packaging may include fan-out wafer-level packaging (FOWLP), fan-out panel-level packaging (FOPLP), fan-in wafer-level packaging (FIWLP), fan-in panel-level packaging (FIPLP), or wafer-level chip-scale packaging (WLCSP) facilitates a high-density package for ICs, including monolithic microwave integrated circuits (MMICs). FOWLP and FOPLP are packaging technologies that allow the use of semiconductor-like thin-film processes (e.g., high-resolution lithographic patterning, physical vapor deposition (PVD) metallizations, and chemical vapor deposition (CVD) dielectrics) to spread out (e.g., fan-out) dense input/output (I/O) connections on the MMIC substrate. In some examples, the IC package 10 can include multiple substrates and/or other circuit components to form a multi-chip module (MCM) or multi-chip package (MCP), or System in package (SiP). In such examples, a common RDL may make connections between the package substrates 75 and/or other circuit components. This package substrate includes vias 76B and interconnects 76A, 76C to facilitate the implementation of this component on a PCB 78.

For example, in one embodiment of the FOWLP process, known-good die (KGD) (e.g., the IC die 12 and a plurality of additional IC dice) and sometimes other passive components are precisely placed onto a temporary carrier, often called reconstructed wafer, and epoxy over-molded to form the overmold layer 70. The KGD can be formed from one or more IC wafers, which are diced to form the IC die 12 and a plurality of additional IC dice, then overmolded into an overmolded IC array. A portion of the overmold layer 70 can be removed to expose a top and/or bottom surface of the IC die 12 such that the overmold layer 70 partially surrounds the IC die 12 (e.g., surrounding only sides of the IC die 12 or sides and one of the top or bottom of the IC die 12).

In certain embodiments, these IC vias 30 through the IC die 12 can facilitate a chip side up orientation of the IC die 12 in the IC package 10, such that the active side 20A is oriented away from a redistribution layer (RDL) and/or a next higher assembly (NHA) to which the IC package 10 attaches. When combined with other technologies, such as copper pillar (CuP) bumping, the IC package 10 can further facilitate three-dimensional (3D) assemblies using chip-stacking and package-on-package (POP) methods.

In certain embodiments, the IC vias 30 of the IC die 12 and/or the backer vias 36 of the backer die 14 through a metallization (e.g., copper). The IC vias 30 of the IC die 12, and the backer vias 36 of the backer die 14 provide a thermal conduction path from the active side 20A of the IC die 12 through the IC die 12 and through the backer die 14. In certain embodiments, the heat transfer through the backside 34B extends into a heat exchanger (e.g., a heatsink or cold plate).

In certain embodiments, an overmold 70 covers the IC die 12 and/or backer die 14. In certain embodiments, the overmold 70 includes conductive vias for further heat dissipation. A high thermal conductivity path can also be created through the top of the IC package 10 if thermal spreaders are formed directly over the hot-spots on the IC die 12. For example, the conductive pillars 72 or other thermally conducting structures are formed over and near heat sources on the IC die 12 (e.g., transistors or other active elements in the active layer).

Semiconductor processes currently practiced could be used to form the conductive pillars 72, similar to the formation of copper bumps for flip-chip-attached semiconductor die. The conductive pillars 72 can be used to conduct heat out of the top of the IC die 12 on the molded side of the IC package 10 if the conductive pillars 72 are suitably exposed from the overmold layer 70. In this regard, the conductive pillars 72 can be formed before or after depositing the overmold layer 70. If formed before, the overmold layer 70 can be partially removed to expose the conductive pillars 72.

In certain embodiments, a heat exchanger 74A, 74B may be attached to the conductive pillars 72 of the overmold 70 and/or the backside 34B of the backer die 14. The heat exchanger may be attached to the conductive pillars 72, the overmold layer 70, and/or the backer die 14 through an appropriate technique, such as soldering or brazing to the conductive pillars 72 or through an adhesive (e.g., a thermal conducting adhesive). In this manner, the conductive pillars 72 further facilitate thermal conduction to a heat exchanger 74A. The heat exchanger 74A, 74B can be a heat sink or cold plate and can exchange heat through liquid, air, conduction, convection, etc., as appropriate.

In certain embodiments, the conductive pillars 72 can provide electrical conduction to features of the IC die 12. For example, a circuit layer can provide interconnection between features of the IC die 12, an RF antenna connected to the IC die 12, connection to external circuits, and so on.

Those skilled in the art will recognize improvements and modifications to the preferred embodiments of the present disclosure. All such improvements and modifications are considered within the scope of the concepts disclosed herein and the claims that follow.

What is claimed is:

1. An electronic device, comprising:
   a backer die comprising:
      a substrate comprising a first thermally conductive material;
      at least one thermal via within the substrate, the at least one thermal via comprising a second thermally conductive material that is more thermally conductive than the first thermally conductive material; and
      at least one capacitor within the substrate; and
   an integrated circuit (IC) die, wherein:
      the IC die has a backside;
      the backside of the IC die is stacked onto the backer die;
      the IC die further comprises an IC plating at the backside thereof; and
      the IC plating comprises an IC plating body and at least one IC capacitor pad electrically insulated from the IC plating body by at least one IC capacitor aperture.

2. The electronic device of claim 1, wherein the IC die comprises a monolithic microwave integrated circuit (MMIC).

3. The electronic device of claim 1, wherein the IC die is bonded to the backer die.

4. The electronic device of claim 1, wherein the IC die includes conductive vias extending from a top side to a bottom side of the IC die.

5. The electronic device of claim 1, wherein the first thermally conductive material comprises silicon.

6. The electronic device of claim 1, wherein the second thermally conductive material comprises copper.

7. The electronic device of claim 1, wherein the at least one thermal via comprises a plurality of thermal vias.

8. The electronic device of claim 7, wherein the plurality of thermal vias are patterned in a two-dimensional array.

9. The electronic device of claim 7,
   wherein the IC die comprises a plurality of amplifiers;
   wherein the plurality of thermal vias are aligned with each of the plurality of amplifiers of the IC die.

10. The electronic device of claim 7, wherein a first portion of the plurality of thermal vias are aligned with each amplifier of the IC die, and a second portion of the plurality of thermal vias are not aligned with any amplifier of the IC die.

11. The electronic device of claim 1, wherein the at least one capacitor comprises a plurality of capacitors.

12. The electronic device of claim 1, wherein the at least one capacitor comprises a deep trench capacitor.

13. The electronic device of claim 1, wherein the at least one capacitor comprises a plurality of deep trench capacitors.

14. The electronic device of claim 1, wherein the IC plating comprises at least one of gold or tin.

15. The electronic device of claim 1,
   wherein the backer die comprises a backer plating at an active side of the substrate;
   wherein the backer plating comprises a backer plating body and at least one backer capacitor pad electrically insulated from the backer plating body by a backer capacitor aperture.

16. The electronic device of claim 15, wherein the backer plating comprises at least one of gold or tin.

17. The electronic device of claim 1,
wherein the IC die further comprises IC plating at a backside thereof;
wherein the IC plating comprises an IC plating body and at least one IC capacitor pad electrically insulated from the IC plating body by at least one IC capacitor aperture;
wherein the backer die comprises a backer conductive plating at an active side of the substrate;
wherein the backer plating comprises a backer plating body and at least one backer capacitor pad electrically insulated from the backer plating body by at least one backer capacitor aperture;
wherein the at least one IC capacitor pad is aligned and electrically coupled with the at least one backer capacitor pad.

18. The electronic device of claim 17,
wherein the at least one IC capacitor pad comprises a plurality of IC capacitor pads; and
wherein the at least one backer capacitor pad comprises a plurality of IC capacitor pads.

19. The electronic device of claim 17, wherein the at least one IC capacitor pad and the at least one backer capacitor pad define a positive terminal of at least one capacitor, and the IC plating body and the backer plating body define a negative terminal of the at least one capacitor.

20. An electronic device, comprising:
a backer die comprising:
a substrate comprising a first thermally conductive material;
a plurality of thermal vias within the substrate, the plurality of thermal vias comprising a second thermally conductive material that is more thermally conductive than the first thermally conductive material; and
at least one capacitor within the substrate; and
an integrated circuit (IC) die, wherein:
the IC die has a backside;
the backside of the IC die is stacked onto the backer die;
the IC die comprises a plurality of amplifiers; and
the plurality of thermal vias are aligned with each of the plurality of amplifiers of the IC die.

* * * * *

UNITED STATES PATENT AND TRADEMARK OFFICE
CERTIFICATE OF CORRECTION

| | | |
|---|---|---|
| PATENT NO. | : 11,699,629 B2 | |
| APPLICATION NO. | : 17/213974 | |
| DATED | : July 11, 2023 | |
| INVENTOR(S) | : Anthony Chiu, Bror Peterson and Andrew Arthur Ketterson | |

It is certified that error appears in the above-identified patent and that said Letters Patent is hereby corrected as shown below:

In the Specification

In Column 4, Line 28, replace "(AIN)" with --(AlN)--.

Signed and Sealed this
Fifteenth Day of August, 2023

Katherine Kelly Vidal
*Director of the United States Patent and Trademark Office*